United States Patent
Tao et al.

(10) Patent No.: US 8,305,827 B2
(45) Date of Patent: Nov. 6, 2012

(54) DUAL RAIL MEMORY

(75) Inventors: Derek C. Tao, Fremont, CA (US); Kuoyuan (Peter) Hsu, San Jose, CA (US); Dong Sik Jeong, Fremont, CA (US); Young Suk Kim, Fremont, CA (US); Young Seog Kim, Pleasanton, CA (US); Yukit Tang, Sunnyvale, CA (US)

(73) Assignee: Taiwan Semiconductor Manufacturing Company, Ltd.

( * ) Notice: Subject to any disclaimer, the term of this patent is extended or adjusted under 35 U.S.C. 154(b) by 169 days.

(21) Appl. No.: 12/835,197

(22) Filed: Jul. 13, 2010

(65) Prior Publication Data

US 2012/0014201 A1   Jan. 19, 2012

(51) Int. Cl.
*G11C 5/14* (2006.01)
(52) U.S. Cl. .................... 365/226; 365/227; 365/228
(58) Field of Classification Search .............. 365/226, 365/227, 228
See application file for complete search history.

(56) References Cited

U.S. PATENT DOCUMENTS

| | | | | |
|---|---|---|---|---|
| 6,195,295 | B1 * | 2/2001 | McPartland | 365/189.05 |
| 6,519,191 | B1 * | 2/2003 | Morishita | 365/189.09 |
| 6,816,418 | B2 * | 11/2004 | Hidaka | 365/189.09 |
| 7,221,611 | B2 * | 5/2007 | Han et al. | 365/226 |
| 7,609,541 | B2 * | 10/2009 | Burnett et al. | 365/154 |
| 7,738,283 | B2 * | 6/2010 | Wong | 365/154 |

* cited by examiner

*Primary Examiner* — Pho M Luu
(74) *Attorney, Agent, or Firm* — Lowe Hauptman Ham & Berner, LLP

(57) ABSTRACT

A memory array comprises a plurality of memory cells arranged in a plurality of rows and a plurality of columns. A column of the plurality of columns includes a first power supply node configured to provide a first voltage, a second power supply node configured to provide a second voltage, and a plurality of internal supply nodes electrically coupled together and configured to receive the first voltage or the second voltage for a plurality of memory cells in the column and a plurality of internal ground nodes. The internal ground nodes are electrically coupled together and configured to provide at least two current paths for the plurality of memory cells in the column.

20 Claims, 3 Drawing Sheets

DUAL RAIL MEMORY

FIELD

The present disclosure is generally related to a memory having two power supplies (e.g., a dual rail memory).

BACKGROUND

Two supply voltages have been used in memories in which the periphery circuitry uses voltage VDDp provided by a first power supply node, and the bit (or cell) arrays use voltage VDDc provided by a second power supply node. In those approaches, to save power in low frequency reading and writing operations (e.g., in the 100 Mhz range), voltage VDDp is lowered, but voltage VDDc is kept at the usual level in order to avoid writing problems that usually occur in low voltage operations (e.g., VDDc is at the minimum required voltage). In high frequency operations (e.g., in the 1 Ghz range), both voltage VDDp and voltage VDDc, however, are kept at the same usual voltage level (e.g., at voltage VDDc) to achieve the desired speed. Those approaches thus save power, e.g., leakage current, in the periphery circuitry, but the bit arrays are still subject to the high power consumption during the active operations (e.g., reading and writing). As a result, little power is saved because during active operations the leakage current affected by voltage VDDc in the bit array is dominant over the leakage current affected by voltage VDDp in the peripheral circuit.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
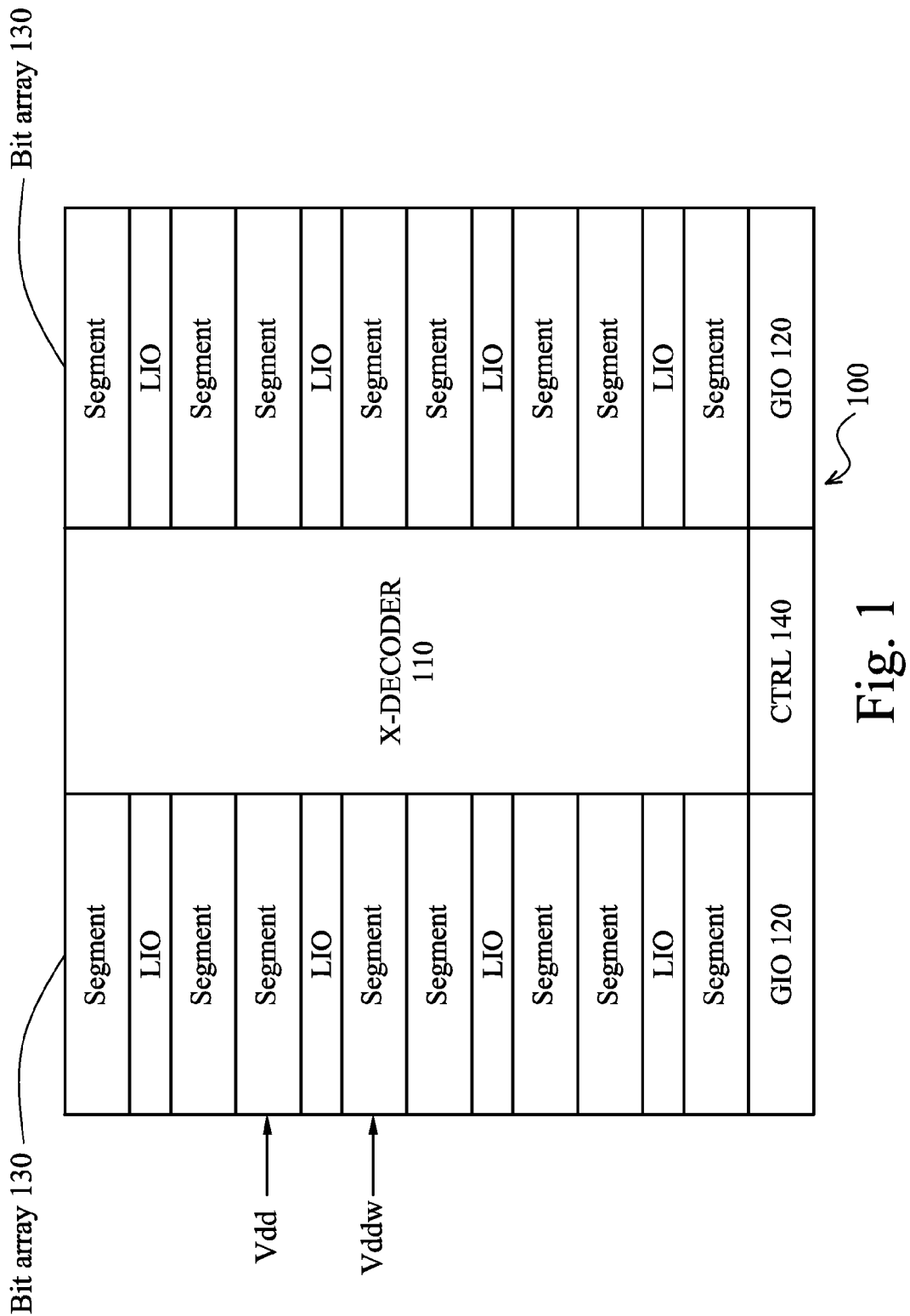
FIG. 1 is a block diagram of a memory in accordance with some embodiments.

Embodiments, or examples, illustrated in the drawings are now disclosed using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments advantageously improve writing, and are more advantageous when the memory uses a low operation voltage (e.g., in situations with the minimum operation voltage, VDDmin). In some embodiments, because in a write operation the accessed column uses a voltage VDDw to write the data to the memory cell, writing is easier because the voltage VDDw being lower than the operation voltage VDD reduces the saturation current in a PMOS transistor constituting the corresponding storage node, which, in turn, makes it easier for the stored data to be changed (e.g., to be replaced by new data). Some embodiments reduce leakage current at the standby and/or retention mode.

Exemplary Circuit

FIG. 1 is a block diagram of a memory 100 in accordance with some embodiments. Memory 100 includes two bit arrays (e.g., memory arrays) 130. Each bit array 130 includes an array of memory cells MC (not shown) arranged in segments (e.g., segments 135, reference numbers 135 are not labeled for simplicity). Each segment 135 includes at least one row and at least one column of memory cells MC. For illustration, each segment 135 includes a plurality of columns of memory cells (e.g., memory cell MC) that expands across the whole horizontal width of bit array 130. In some embodiments, a row of local input/output circuits (e.g., LIO 137, reference numbers 137 are not labeled for simplicity) is sandwiched between two segments 135 (e.g., an upper segment and a lower segment) and includes circuitry for controlling the respective lower and upper segments.

X-decoder 110 provides the X- or row-address of a memory cell to be accessed (e.g., the memory cell from which data is read from or written to).

Control circuit 140 provides the pre-decode, clock, y-decoder, and other signals to memory 100.

Global input/output circuits (e.g., GIOs) 120 serve as mechanisms for transferring data between the memory cells MC and other circuitries.

X-decoder 110, global GIOs 120, and control circuit 140 are commonly called peripheral circuitry, which, in some embodiments, uses voltage VDD in various operations (e.g., retention, standby, read, and write operations).

Memory 100 is called a dual rail memory because memory 100 uses two supply nodes providing two voltages, e.g., voltage VDD and voltage VDDw.

In some embodiments, a power supply (not shown) external to the semiconductor chip embodying memory 100 provides voltage VDDw. In some further embodiments, a voltage regulator (not shown) internal to the semiconductor chip provides voltage VDDw. Further, nodes of voltage VDDw are coupled together to avoid noise from power node switching and thus improve reliability. In some embodiments, voltage VDDw is about 90% of voltage VDD, and is higher than the minimum voltage to retain data in the memory cells (e.g., retention voltage Vret). In some embodiments, voltage VDD is about 1.0 V, voltage VDDw is about 0.9 V and voltage Vret is about 0.65 V.

FIG. 1 shows memory 100 for illustration, but embodiments of the disclosure are not so limited, and are usable independent of the memory architecture.

Figure 2:
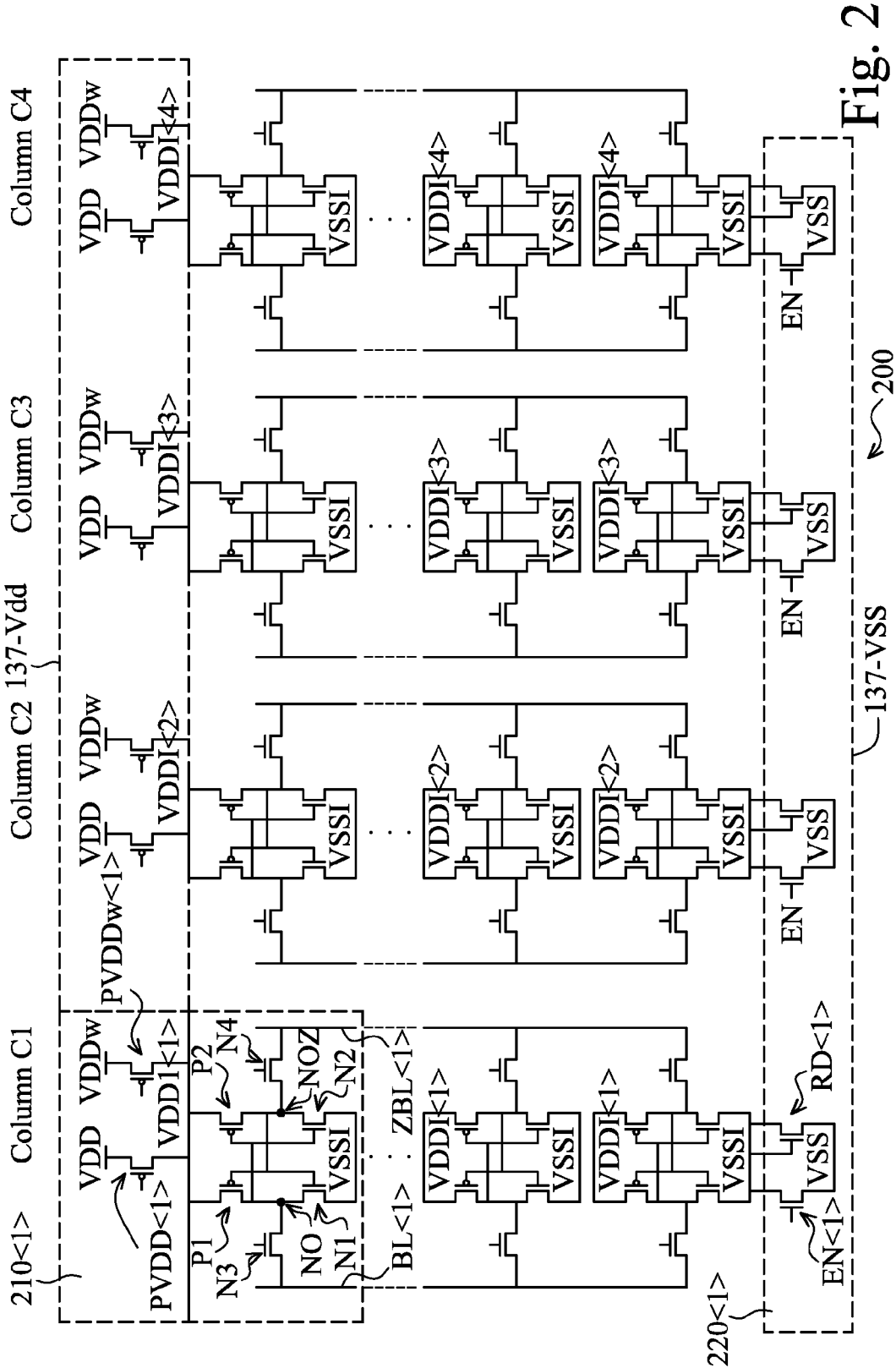
FIG. 2 is a diagram of a portion of a segment of the memory in FIG. 1, in accordance with some embodiments.

FIG. 2 is a diagram of a section 200 illustrating a portion of a segment 135, in accordance with some embodiments. Section 200 is coupled to a local IO 137, which, for illustration, is shown including a section 137-VDD and a section 137-VSS. In this section 200, a local IO 137 is illustratively shared between 4 columns (e.g., column C1 to column C4) of section 200, but the number of columns sharing a local IO 137 is any number greater than 0. Further, a segment 135 includes one or a plurality of sections 200. In some embodiments, all nodes of voltage VDD in memory 100 are coupled together, all nodes of voltage VDDw are coupled together, and all nodes of voltage VSS are coupled together (e.g., to ground).

A column of memory cells is coupled to a pair of bit lines (e.g., a bit line BL and a bit line ZBL). For simplicity, only bit lines BL<1> and ZBL<1> (e.g., the bit lines of column C1) are labeled.

A power circuit 210 of a column provides power (e.g., voltage VDD or voltage VDDw) to memory cells in that column. For simplicity, only power circuit 210<1> (e.g., power circuit 210 for column C1) is labeled. In some embodiments, all nodes VDDI (the drains of transistors PVDD and PVDDw and the sources of transistors P1 and P2) in a column are coupled together. For example, all nodes VDDI<1> of column C1 (or the drains of transistors PVDD<1> and PVDDw<1>, and the sources of transistors P1<1> and P2<1>) are coupled together. All nodes VDDI<2> of column 2 (or the drains of transistors PVDD<2> and PVDDw<2>, and the sources of transistors P1<2> and P2<2>) are coupled together, etc. Nodes VDDI are called internal supply nodes because nodes VDDI receive either supply voltage VDD or voltage VDDw for memory cells MC in memory 100. When a transistor PVDD of a column (e.g., transistor PVDD<1> of column C1) is on, voltage VDD is passed to nodes VDDI (e.g., nodes VDDI<1>) of that column (e.g., column C1). Similarly, when a transistor PVDDw of a column (e.g., transistor PVDDw<1> of column C1) is on, voltage VDDw is passed to nodes VDDI (e.g., nodes VDDI<1>) of column C1. In some embodiments, when a transistor PVDD (e.g., transistor PVDD<1>) is on, the corresponding transistor PVDDw<1> is off, and when the transistor PVDDw<1> is on, the corresponding transistor PVDD<1> is off. In some embodiments, transistors PVDD and PVDDw are PMOS. As a result, a high voltage level (e.g., a High) driven to the gate of a transistor PVDD or a transistor PVDDw turns that transistor off. In contrast, a low voltage level (e.g., a Low) driven to the gate of a transistor PVDD or a transistor PVDDw turns that transistor on.

A ground circuit 220 of a column provides grounding mechanisms and/or current paths for that column. For simplicity, only ground circuit 220<1> (e.g., ground circuit 220 for column C1) is labeled. In some embodiments, a node VSSI couples the sources of the corresponding transistors N1 and N2, and in a column (e.g. column C1) all nodes VSSI (e.g., all nodes VSSI<1>) are coupled to the drains of the transistor EN and of retention diode RD in the same column (e.g., transistor En<1> and retention diode RD<1>). Further, in some embodiments, to save layout space, all nodes VSSI in memory 100 (i.e., all nodes VSSI in all segments 135 in all memory arrays 130) are coupled together. Nodes VSSI are called internal ground nodes because nodes VSSI serve as means for currents in memory cells MC in memory 100 to flow to ground (or VSS). When a transistor EN (e.g., transistor EN<1>) is on, transistor EN<1> pulls the voltage level of its drain (e.g., nodes VSSI<1>) to the voltage level of its source (e.g., VSS). But when a transistor EN<1> is off any leakage current flows through nodes VSSI<1> to the corresponding retention diode RD<1>. In some embodiments, the current drawn by a transistor EN (e.g., current Ien) is in the µA range (e.g., 10 µA), which is substantially greater than a current drawn by a retention diode RD (e.g., current Ird), which is normally in the pA range. The ratio of current Ien over current Ird is thus about 1000, and varies depending on the number of memory cells in a column, the design of transistor EN and diode RD. The higher the ratio, the more power is saved when the current flows through diode RD instead of through transistor EN. A retention diode RD is so called because, in some embodiments, it serves as a current path to retain the data stored in memory nodes NO and ZNO. In some embodiments, an NMOS transistor having its gate coupled to its drain forms a retention diode RD. Further, another NMOS transistor is used as a transistor EN. As a result, a High driven to the gate of a transistor EN turns it on while a Low driven to its gate turns it off.

FIG. 1 shows a separate power circuit 210<1> and a ground circuit 220<1> in the respective sections 137-VDD and 137-VSS for illustration. A circuit 210 and a circuit 220 can be in the same circuit and/or in different circuits 137. The disclosed embodiments are not limited to the location of those circuits 210 and 220 and/or the circuitry constituting an LIO 137.

Each memory cell MC in memory 100 includes similar components. For simplicity, only details of one memory cell MC in column C1 are labeled. Transistors P1, P2, N1, and N2 form a cross latch for a memory cell MC. Nodes NO and ZNO store data for a memory cell MC. Transistors N3 and N4 serve as mechanisms for transferring data between nodes NO and ZNO to the respective bit lines BL and ZBL. In a read operation for a memory cell MC, the data stored in nodes NO and ZNO are transferred through the respective transistors N3 and N4 to the respective bit lines BL and ZBL, which are then processed accordingly. In a write operation, the data on lines BL and ZBL are transferred through the respective transistors N3 and N4 to the respective nodes NO and ZNO.

Illustrative Operations

In some embodiments, memory 100 operates in four modes, including a (data) retention mode, a standby mode, a read mode, and a write mode. A retention mode indicates memory 100 receives voltage VDD and/or voltage VDDw sufficient for the memory cells MC to retain the data stored in nodes NO and ZNO. A standby mode indicates memory 100 is not in an active mode of reading or writing, but, for example, memory 100 is getting ready for reading or writing, memory 100 is in a reduced power consumption mode, etc. In some embodiments, a standby mode is the same as a retention mode because memory 100, when not being active, is provided with the power (e.g., voltage VDD and/or voltage VDDw) just sufficient to retain the stored data. For illustration, in the below discussion, unless otherwise stated, the term "standby mode" includes the standby and/or retention mode. A read mode indicates the data stored in nodes NO and ZNO is provided to other circuits while a write mode indicates the data is written to (and thus is stored in) nodes NO and ZNO. Depending on the balance between the risk of data being corrupted and the need to save power in un-accessed cells, un-accessed columns and/or un-accessed segments nodes VDDI are connected to voltage VDD or voltage VDDw and/or voltage VDDw is kept at about 10% of voltage VDD or lowered to the retention voltage Vret of about 0.65V. To avoid the risk of the data in the un-accessed cells, un-accessed columns and/or un-accessed segments being corrupted, the corresponding nodes VDDI are connected to voltage VDD because, in some embodiments, the higher the supply voltage for a memory cell MC, the more difficult it becomes for the data in the cells to be corrupted. To save power, however, the corresponding nodes VDDI are connected to voltage VDDw and/or the voltage level of voltage VDDw is lowered to voltage Vret because the lower the supply voltage that is provided to a memory cell, the lower the power dissipated by and/or current leaked by the memory cell.

In some embodiments, in a standby mode all transistors EN in memory 100 (e.g., all transistors EN in all segments 135 in all bit arrays 130) are off. As a result, any leakage current in memory cells MC flows through the corresponding retention diodes RD, which saves power because, in some embodiments, retention diodes RD are designed to draw minimum current sufficient to retain the data stored in nodes NO and ZNO. If transistors EN were on, transistors EN would draw currents substantially more than the current leaked through retention diodes RD. In some embodiments, all nodes VDDI in memory 100 are connected to one or a combination of voltage VDD and voltage VDDw. Selecting voltage VDD or voltage VDDw and a particular voltage level for memory 100 in the standby mode is a matter of design choice because, in this mode, memory 100 is not "actively operating" (e.g., not writing nor reading), nodes VDDI are provided with a voltage sufficient to retain the data stored in the memory, considering the risk of corrupting the stored data if the supplied voltage is (too) low. In some embodiments, to save power, one or a combination of voltage VDD and voltage VDDw is lowered to a voltage level sufficient to retain the stored data.

In some embodiments, when memory 100 is accessed (either for reading or writing), a plurality of memory cells MC in a row of a segment 135 is accessed (e.g., the accessed memory cells AMC). Memory cells in memory 100 other than the accessed memory cells AMC are called un-accessed memory cells UAMC. A segment 135 having an accessed memory cell AMC is called an accessed segment AS. A segment 135 having all un-accessed memory cells UAMC is called an un-accessed segment UAS. Each memory cell MC of the accessed memory cells AMC is from a column of a section 200. A column having an accessed memory cell AMC is called an accessed column AC. A column having all un-accessed memory cells UAMC is called an un-accessed column UAC. For illustration, a segment 135 includes three sections 200, e.g., sections 200A, 200B, and 200C (not labeled), and each section 200A, 200B, and 200C includes four columns C1, C2, C3, C4 as illustrated in FIG. 2. For a further example, the accessed memory cells AMC are in row 1 and in the accessed columns C1. The accessed memory cells AMC, in some embodiments, include accessed memory cells AMC in row 1 and in columns C1 of the respective sections 200A, 200B, and 200C. If the accessed columns AC are columns C2, then the accessed memory cells AMC include the accessed memory cells AMC in row 1 and in columns C2 of the respective sections 200A, 200B, and 200C. If the accessed columns AC are columns C3, then the accessed memory cells AMC include the accessed memory cells AMC in row 1 and in columns C3 of the respective sections 200A, 200B, and 200C, etc. A segment 135 having three sections 200A, 200B, and 200C above is used for illustration. A segment 135 has any number (1 or greater) of sections 200. Similarly, a section 200 has any number (1 or greater) of columns.

In some embodiments, in a read operation (e.g., memory 100 is in a read access), transistors EN in the accessed segment AS are turned on, pulling the corresponding nodes VSSI (the drains of transistors EN) to the corresponding sources of transistors EN to VSS or ground. Transistors EN in un-accessed segments UAS are turned off to save power. Further, nodes VDDI of the accessed segment AS are connected to voltage VDD. Nodes VDDI of the un-accessed segments UAS are connected to either voltage VDD or voltage VDDw. In some embodiments, to save power, nodes VDDI of un-accessed segments UAS are connected to voltage VDDw, and voltage VDDw is lowered to about the retention voltage Vret.

In some embodiments, in a write operation (e.g., memory 100 is in a write access), transistors EN in the accessed segment AS are turned on, pulling the corresponding nodes VSSI (the drains of transistors EN) to the corresponding sources of transistors EN to VSS or ground. Transistors EN in un-accessed segments UAS are turned off to save power. Further, all nodes VDDI in the accessed columns AC are connected to voltage VDDw to assist in writing, i.e., enabling writing to the accessed memory cells AMC easier. All nodes VDDI in un-accessed columns UAC of the accessed segment AS are connected to VDD. In some embodiments, all nodes VDDI of the un-accessed segments UAS are connected to either voltage VDD or voltage VDDw.

In an accessed column, e.g., column C1, because nodes VDDI<1> are connected to voltage VDDw, transistors P1 and P2 (e.g., all transistors P1<1> and P2<1>) of the access memory cells AMC are weaker than the corresponding transistors N3 and N4 (e.g., transistors N3<1> and N4<1>) of the same accessed memory cell AMC. As a result, writing to nodes NO and ZNO of the accessed memory cells AMC are easier.

Illustrative Method

Figure 3:
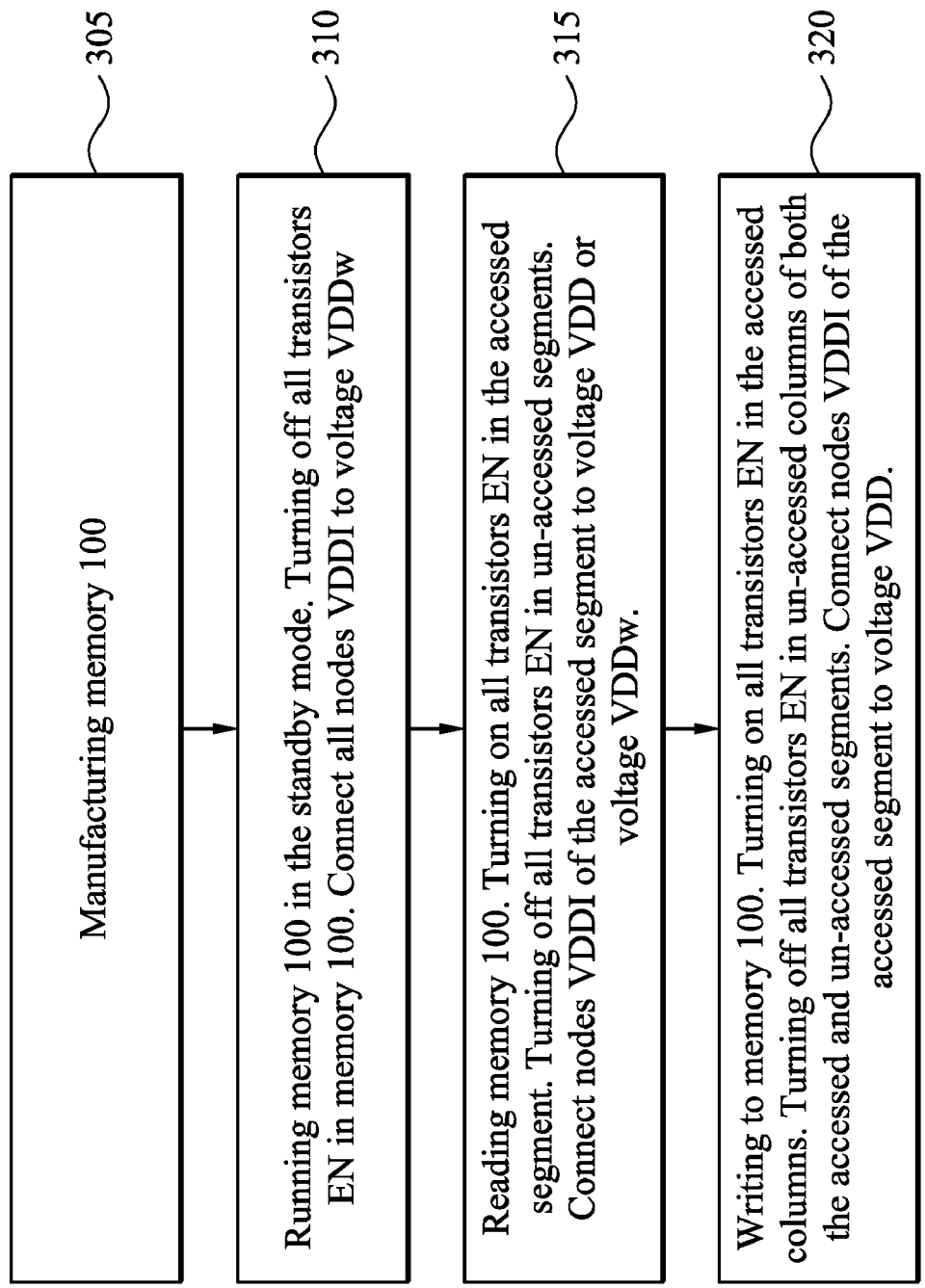
FIG. 3 is a flowchart illustrating a method for operating the memory in FIG. 1, in accordance with some embodiments.

FIG. 3 is a flowchart 300 illustrating a method for operating a memory 100, in accordance with some embodiments.

In step 305, memory 100 is manufactured having, for example, two memory arrays 130. Each memory array 130 has a plurality of segments 135. Each segment 135 has a three sections 200A, 200B, and 200C, and each of sections 200A, 200B, and 200C has two rows RO1 and RO2 and four columns, i.e., column C1, column C2, column C3, and column C4. All nodes of voltage VDD are coupled together. All nodes VDDw are coupled together. All nodes VDDI in a column are coupled together (e.g., all nodes VDDI<1> are coupled together; all nodes VDDI<2> are coupled together, all nodes VDDI<3> are coupled together, etc.). All nodes VSS are coupled together, and all nodes VSSI are coupled together.

In step 310, memory 100 is configured to a standby mode (or a data retention mode) where all transistors EN are turned off. For illustration, all nodes VDDI<1>, VDDI<2>, VDDI<3>, and VDDI<4>) are connected to voltage VDDw, and to save power, voltage VDDw is lowered to voltage Vret sufficient to retain the stored data. The nodes VDDI in any column, however, can be connected to voltage VDD, and to save power, voltage VDD are lowered to voltage Vret.

In step 315, memory 100 is configured to a read mode. For illustration, the data is read from memory cells (the accessed memory cells AMC) in an arbitrary segment 135 (e.g., segment 135R, not labeled). Further, the accessed memory cells AMC are in row RO1 and in each column C1 of each section 200A, 200B, and 200C of segment 135R. In this illustration, all transistors EN in the accessed segment 135R are turned on. All transistors EN in un-accessed segments (e.g., segments 135 other than segment 135R) are turned off. All nodes VDDI of the accessed segment 135R are connected to voltage VDD. Depending on priorities between avoiding the risk of corrupting data stored in un-accessed segments and saving power, nodes VDDI of the un-accessed segments are connected to voltage VDD or voltage VDDw, respectively. For illustration of saving power, all nodes VDDI of the un-accessed segments UAS are connected to voltage VDDw and voltage VDDw is lowered to voltage Vret.

In step 320, memory 100 is configured to a write mode. For illustration, the data is written to memory cells (the accessed memory cells AMC) in an arbitrary segment 135 (e.g., segment 135W, not labeled). Further, the accessed memory cells AMC are in row RO1 and in each column C1 of each section 200A, 200B, and 200C of segment 135W. In this illustration, all transistors EN in the accessed columns C1 of each section 200A, 200B, and 200C are turned on. All transistors EN in un-accessed columns C2, C3, and C4 of each section 200A, 200B, and 200C and in un-accessed segments (e.g., segments 135 other than segment 135W) are turned off. All nodes VDDI of the accessed segment 135W are connected to voltage VDDw. Depending on priorities between avoiding the risk of corrupting data stored in un-accessed segments and saving power, nodes VDDI of the un-accessed segments are connected to voltage VDD or voltage VDDw, respectively. For illustration of saving power, all nodes VDDI of the un-accessed segments UAS are connected voltage VDDw, and voltage VDDw is lowered to voltage Vret.

A number of embodiments have been described. It will nevertheless be understood that various modifications can be made without departing from the spirit and scope of the disclosure. For example, the various transistors being shown as a particular dopant type (e.g., NMOS (N-type Metal Oxide Silicon) and PMOS (P-type Metal Oxide Silicon)) are for illustration purposes. Embodiments of the disclosure are not limited to a particular type, but the dopant type selected for a particular transistor is a design choice and is within the scope of the embodiments. The logic level (e.g., Low or High) of the various signals used in the above description is also for illustration purposes, the embodiments are not limited to a particular level when a signal is activated and/or deactivated, but, rather, selecting such a level is a matter of design choice. In various situations, a transistor functions as a switch (e.g., transistor P1, P2, etc.). As a result, a switch can be used in place of a transistor. In the illustrative embodiments, an NMOS is configured as a retention diode RD, but the embodiments are not so limited, any device providing a current path is within the scope of the embodiments.

The illustrative method shows exemplary steps, but they are not necessarily performed in the order shown. Steps may be added, replaced, changed order, and/or eliminated as appropriate, in accordance with the spirit and scope of the disclosed embodiments.

Each claim of this document constitutes a separate embodiment, and embodiments that combine different claims and/or different embodiments are within the scope of the disclosure and will be apparent to those of ordinary skill in the art after reviewing this document.

What is claimed is:

1. A memory array comprising a plurality of memory cells arranged in a plurality of rows and a plurality of columns, at least one of the plurality of columns including:
   a first power supply node configured to provide a first voltage;
   a second power supply node configured to provide a second voltage;
   a plurality of internal supply nodes electrically coupled together and configured to receive one of the first voltage or the second voltage for a plurality of memory cells in the column;
   a plurality of internal ground nodes electrically coupled together and configured to provide at least two current paths, including a first current path and a second current path, for the plurality of memory cells in the column; and
   a diode coupled to the plurality of internal ground nodes, and configured to be used in the second current path.

2. The memory array of claim 1 further comprising:
   a first switch coupled to the plurality of internal supply nodes, and configured to be used by the first power supply node to provide the first voltage; and
   a second switch coupled to the plurality of internal supply nodes, and configured to be used by the second power supply node to provide the second voltage.

3. The memory array of claim 2 wherein when the first switch is configured to be on, the second switch is configured to be off, and when the second switch is configured to be on the first switch is configured to be off.

4. The memory array of claim 1 further comprising an NMOS transistor electrically coupled to the plurality of internal ground nodes, and configured to be used in the first current path of the at least two current paths.

5. The memory array of claim 4, wherein the NMOS transistor is configured to be turned on during a write operation.

6. The memory array of claim 1 wherein in a write operation of a memory cell in the at least one column, the plurality of the internal supply nodes of the respective column is configured to receive the second voltage, and the second voltage is lower than the first voltage.

7. The memory array of claim 1 being configured to cause a first current flowing in the first current path of the at least two current paths to be greater than a second current flowing in the second current path of the at least two current paths.

8. The memory array of claim 1, wherein the diode comprises a diode-connected transistor.

9. A method for a memory array of memory cells having at least one segment; each memory cell having an internal power supply node and an internal ground node; a segment having at least one section; each section having at least one column and at least one row; each column having a first node providing a first voltage and a second node providing a second voltage different from the first voltage, and at least two current paths coupled to each internal ground node of each memory cell in the each column; the first voltage and the second voltage being for use by each internal power supply node of each memory cell in each column; a first current flowing through a first current path being greater than a second current flowing through the second current path; writing to an accessed memory cell of an accessed column of an accessed section of an accessed segment, the method, in the accessed section, including the steps of:
   providing the second voltage to each internal power supply node of each memory cell in the accessed column;
   providing the first voltage to each internal power supply node of each memory cell in an un-accessed column; and
   using the first current path for each ground node of each memory cell in the accessed column and for each ground node of each memory cell in the un-accessed column.

10. The method of claim 9 wherein writing to the accessed memory cell of the accessed column of the accessed section of the accessed segment further comprising, in an un-accessed section of the accessed segment, the steps of:
   providing the first voltage to each internal supply node of each memory cell in each column; and
   using the first current path for each ground node of each memory cell in each column.

11. The method of claim 9 wherein writing to the accessed memory cell of the accessed column of the accessed section of the accessed segment further comprising, in an un-accessed segment having at least one column, the steps of:
   using the second current path for each ground node for each memory cell in each column; and
   for the at least one column, providing one or a combination of the first voltage and the second voltage to each internal supply node of each memory cell.

12. The method of claim 11 further comprising using a retention voltage as the second voltage for each internal supply node of each memory cell for the at least one column of the un-accessed segment.

13. The method of claim 9 further comprising at least one of the following steps:
   using an NMOS transistor coupled to each internal ground node of each memory cell in the accessed column as a first current path for the each memory cell in the accessed column; and
   using a diode coupled to each internal ground node of each memory cell in the accessed column as a second current path for the each memory cell in the accessed column.

14. A method for a memory array of memory cells having at least one segment; each memory cell having an internal power supply node and an internal ground node; a segment having at least one section; each section having at least one column and at least one row; each column having a first node providing a first voltage and a second node providing a second voltage different from the first voltage, and at least two current paths coupled to each internal ground node of each memory cell in the each column; the first voltage and the second voltage being for use by each internal power supply node of each memory cell in each column; a first current flowing through a first current path being greater than a second current flowing through the second current path; reading from an accessed memory cell of an accessed column of an accessed section of an accessed segment, the method comprising, in the accessed section, the steps of:

providing the first voltage to each internal power supply node of each memory cell; and using the first current path for each ground node for each memory cell.

15. The method of claim 14 further comprising:

in an un-accessed segment having at least one column using the second current path for each ground node of each memory cell in each column; and for the at least one column, providing one or a combination of the first voltage and the second voltage to each internal supply node of each memory cell.

16. The method of claim 15 further comprising using a retention voltage as the second voltage for each internal supply node of each memory cell for the at least one column of the un-accessed segment.

17. The method of claim 14 further comprising at least one of the following steps:

using an NMOS transistor coupled to each internal ground node of each memory cell in the accessed column as a first current path for the each memory cell in the accessed column; and using a diode coupled to each internal ground node of each memory cell in the accessed column as a second current path for the each memory cell in the accessed column.

18. A method for a memory array of memory cells having at least one segment; each memory cell having an internal power supply node and an internal ground node; a segment having at least one section; each section having at least one column and at least one row; each column having a first node providing a first voltage and a second node providing a second voltage different from the first voltage, and at least two current paths coupled to each internal ground node of each memory cell in the each column; the first voltage and the second voltage being for use by each internal power supply node of each memory cell in each column; a first current flowing through a first current path being greater than a second current flowing through the second current path; running the memory array in a standby mode including the steps of using the second current path for each ground node of the memory cells; and providing one or a combination of the first voltage and the second voltage to each internal supply node of each memory cell.

19. The method of claim 18 further comprising:

using a retention voltage for one or a combination of the first voltage and the second voltage.

20. The method of claim 18 further comprising at least one of the following steps:

using an NMOS transistor coupled to an internal ground node of each memory cell in an accessed column as the first current path for each memory cell in the accessed column; and using a diode coupled to the internal ground node of each memory cell in the accessed column as the second current path for each memory cell in the accessed column.

\* \* \* \* \*